(12) United States Patent
Mani

(10) Patent No.: US 9,419,205 B2
(45) Date of Patent: Aug. 16, 2016

(54) METHODS FOR MANUFACTURING CARBON RIBBONS FOR MAGNETIC DEVICES

(71) Applicant: III Holdings 1, LLC, Wilmington, DE (US)

(72) Inventor: Krishnakumar Mani, San Jose, CA (US)

(73) Assignee: III HOLDINGS 1, LLC, Wilmington, DE (US)

( * ) Notice: Subject to any disclaimer, the term of this patent is extended or adjusted under 35 U.S.C. 154(b) by 0 days.

(21) Appl. No.: 14/538,423

(22) Filed: Nov. 11, 2014

(65) Prior Publication Data

US 2015/0129998 A1    May 14, 2015

Related U.S. Application Data

(63) Continuation of application No. 13/427,373, filed on Mar. 22, 2012, now Pat. No. 8,900,883.

(51) Int. Cl.
| | |
|---|---|
| H01L 29/82 | (2006.01) |
| H01L 27/22 | (2006.01) |
| G11C 11/34 | (2006.01) |
| H01L 43/02 | (2006.01) |
| H01L 43/08 | (2006.01) |
| H01L 43/12 | (2006.01) |
| G11C 11/15 | (2006.01) |
| G11C 11/16 | (2006.01) |
| H01L 21/02 | (2006.01) |

(52) U.S. Cl.
CPC .............. *H01L 43/02* (2013.01); *H01L 27/228* (2013.01); *H01L 43/08* (2013.01); *H01L 43/12* (2013.01); *G11C 11/15* (2013.01); *G11C 11/16* (2013.01); *G11C 2213/35* (2013.01); *H01L 21/0262* (2013.01); *H01L 21/02527* (2013.01)

(58) Field of Classification Search
CPC ......... H01L 29/82; H01L 27/22; G11C 11/16
USPC ............................. 257/421, 427; 365/185.05
See application file for complete search history.

(56) References Cited

U.S. PATENT DOCUMENTS

| | | | |
|---|---|---|---|
| 6,845,038 B1 * | 1/2005 | Shukh .................... | G11C 11/14 365/164 |
| 6,900,002 B1 | 5/2005 | Plat et al. | |
| 8,093,576 B1 | 1/2012 | Lee | |
| 2005/0233257 A1 | 10/2005 | Latchford et al. | |
| 2006/0292808 A1 | 12/2006 | Autryve et al. | |
| 2007/0018218 A1 * | 1/2007 | Kretz .................... | H01L 21/845 257/296 |
| 2007/0141256 A1 | 6/2007 | Liebau et al. | |
| 2009/0201715 A1 * | 8/2009 | Kreupl ............... | G11C 13/0004 365/148 |
| 2011/0204474 A1 | 8/2011 | Kreupl et al. | |
| 2012/0132822 A1 * | 5/2012 | Okada ..................... | H04N 5/32 250/370.08 |

\* cited by examiner

*Primary Examiner* — Long K Tran
(74) *Attorney, Agent, or Firm* — McAndrews, Held & Malloy, Ltd.

(57) ABSTRACT

In one embodiment of the invention, there is provided a method for manufacturing a magnetic memory device, comprising: depositing a carbon layer comprising amorphous carbon on a substrate; annealing the carbon layer to activate dopants contained therein; and selectively etching portions of the carbon layer to forms lines of spaced apart carbon conductors.

20 Claims, 16 Drawing Sheets

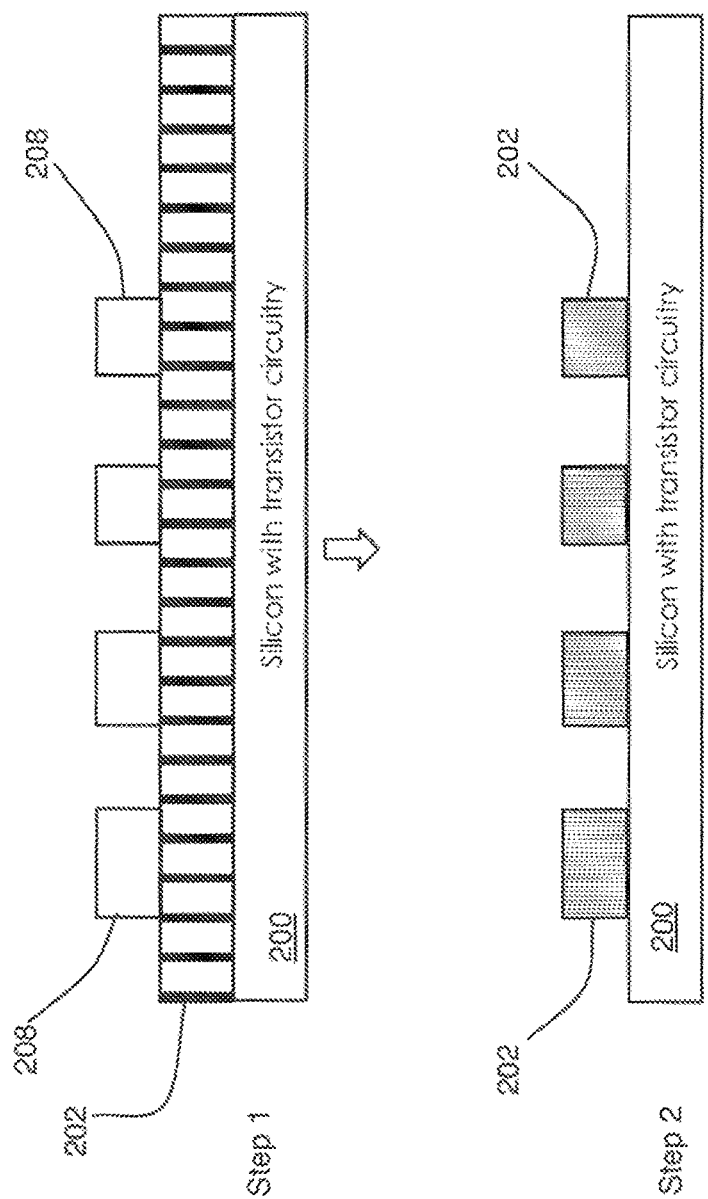

METHODS FOR MANUFACTURING CARBON RIBBONS FOR MAGNETIC DEVICES

CROSS REFERENCE TO RELATED APPLICATIONS

This application is a continuation of U.S. patent application Ser. No. 13/427,373 filed Mar. 22, 2012, the entire specification of which application is incorporated herein by reference.

Embodiments of the invention relate to the manufacturing of magnetic memory devices.

BACKGROUND

Magnetic memory device may include magnetic memory circuits that are based on magneto-resistive behavior of magnetic storage elements that are integrated typically with a complementary metal-oxide-semiconductor (CMOS) technology. Such memory circuits generally provide non-volatility and an unlimited read and write capability. An example is the magnetic random access memory (MRAM) circuit that includes a plurality of memory cells, each defining an addressable magnetic storage element that may include a magnetic tunnel junction (MTJ) stack.

Each addressable MTJ stack can have a magnetic spin orientation and can be flipped between two states by the application of a magnetic field that is induced by energizing corresponding bit and word lines. Conductive wires comprising the word and bit lines are required to carry a high current density in order to generate the switching fields necessary to operate the magnetic memory circuits.

BRIEF DESCRIPTION OF THE DRAWINGS

FIGS. 7A-B illustrates a process for forming conductive carbon ribbons for a magnetic memory, in accordance with a sixth embodiment of the invention.

DETAILED DESCRIPTION

In the following description, for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Broadly, embodiments of the present invention disclose techniques to manufacture conductive carbon wires and ribbons for magnetic memory devices. A magnetic memory device with conductive carbon wire is also disclosed.

Figure 1A:
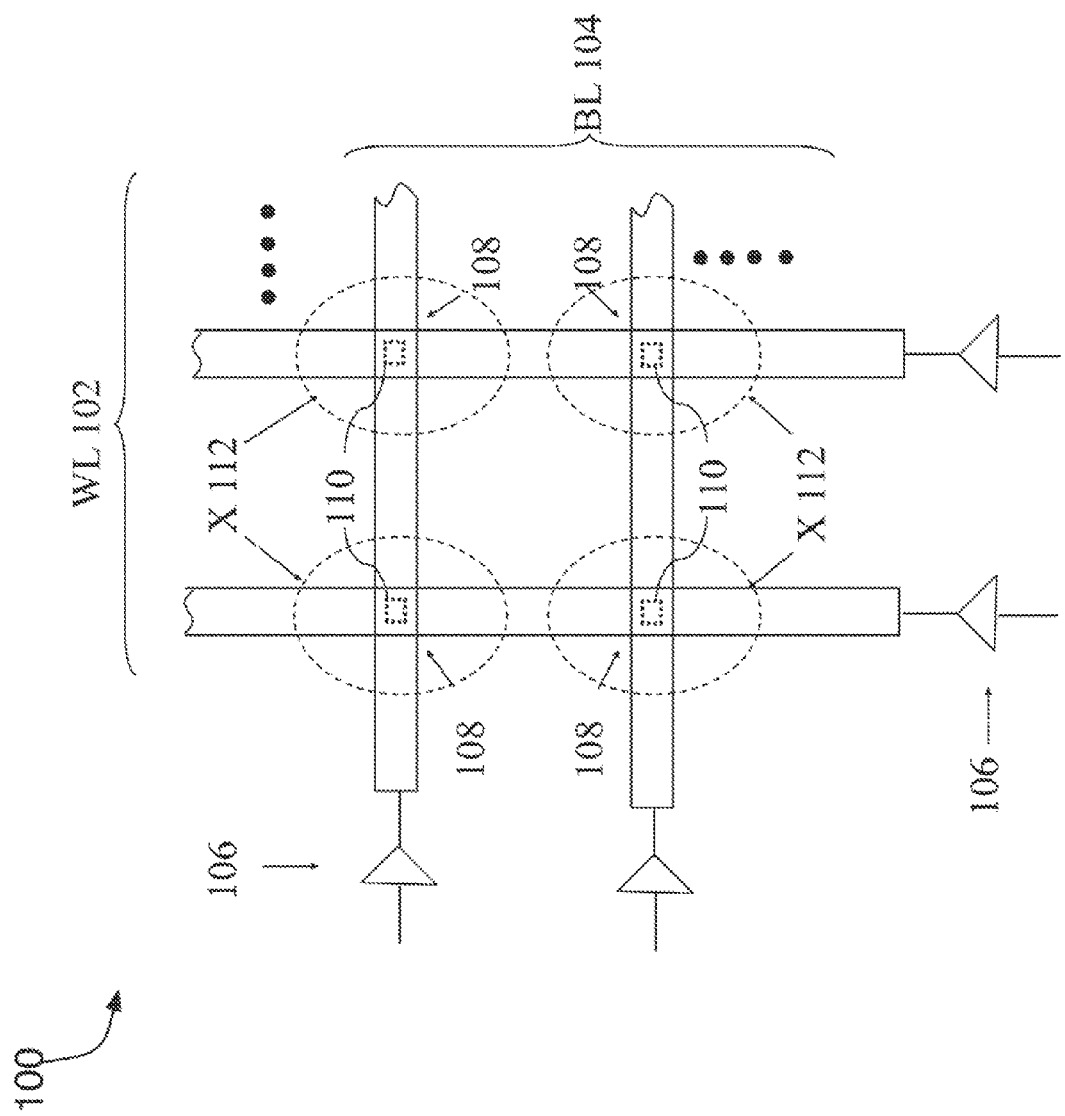
FIG. 1A shows a plan view of an exemplary array of memory cells.

FIG. 1A illustrates a plan view of a section of an exemplary array 100 of memory cells X 112 in an MRAM circuit, that includes a set of longitudinal word lines (WL) 102 and a set of transverse bit lines (BL) 104. The set of bit lines 104 overlies the set of word lines 102 to define crossover zones 108. An addressable MTJ stack 110 is disposed within each crossover zone 108. Current drivers 106 are provided for energizing the bit lines 104 and the word lines 102. An address transistor (not shown) is provided under each MTJ stack 110 and in the memory cell X 112, for reading the state of the MTJ stack 110.

Figure 1B:
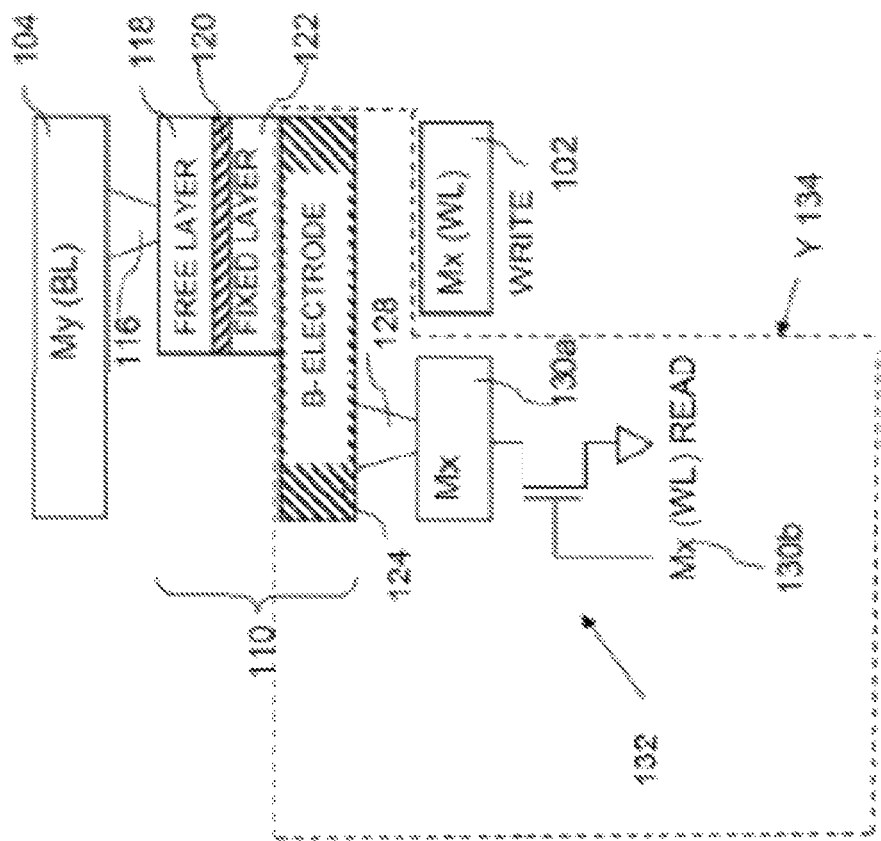
FIG. 1B shows a partly schematic and partly cross-sectional view of the memory cell of FIG. 1A

FIG. 1B illustrates a partly schematic and partly cross-sectional view of the memory cell X 112 in FIG. 1A. As shown in the cross-sectional view, the MTJ stack 110 is disposed within the crossover zone 108. The address transistor 132 is shown schematically.

Generally, the MTJ stack 110 is designed to be integrated into a back-end metallization structure following a front-end CMOS processing. The MTJ stack 110 is shown to be provided between a first metallization layer Mx and a second metallization layer My, wherein the MTJ stack 110 is connected to the first layer Mx through a via hole 128 and to the second layer My through a via hole 116. The second layer My is patterned to include the BL 104. The MTJ stack 110 includes a free layer 118, a tunnel oxide layer 120, a fixed layer 122 and an extended bottom electrode 124. The first layer Mx is patterned to include the WL 102 for writing into the MTJ stack 110. The address transistor 132 is connected to the first layer Mx by a connection 130a. A read word line (WL) 130b in the first layer Mx is usable for selectively operating the address transistor 132. The WL 102 has no contact with the bottom electrode 124, and when energized, induces a magnetic field within the MTJ stack 110.

A write operation in a selected memory cell X 112 in the array 100 can be performed by energizing the corresponding BL 104 and the WL 102, to generate a magnetic field for changing the magnetic state of the corresponding MTJ stack 110. For a read operation, a voltage is applied to the BL 104 of the selected memory cell X 112, so that a current can flow through the corresponding MTJ stack 110 and the address transistor 132 that is selectively switched on by the WL 130b. The magnitude of the current sensed indicates the conductivity or the magnetic state of the MTJ stack 110.

The bit lines and the word lines of the MRAM device described above may be implemented as conductive carbon wires/ribbons fabricated in accordance with any one of the embodiments described below.

Various embodiments of the method for manufacturing conductive wires/ribbons will now be described with reference to FIGS. 2 to 5 of the drawings. In these drawings the same reference numerals have been used to indicate the same or similar features and steps.

First Embodiment

Figure 2A:
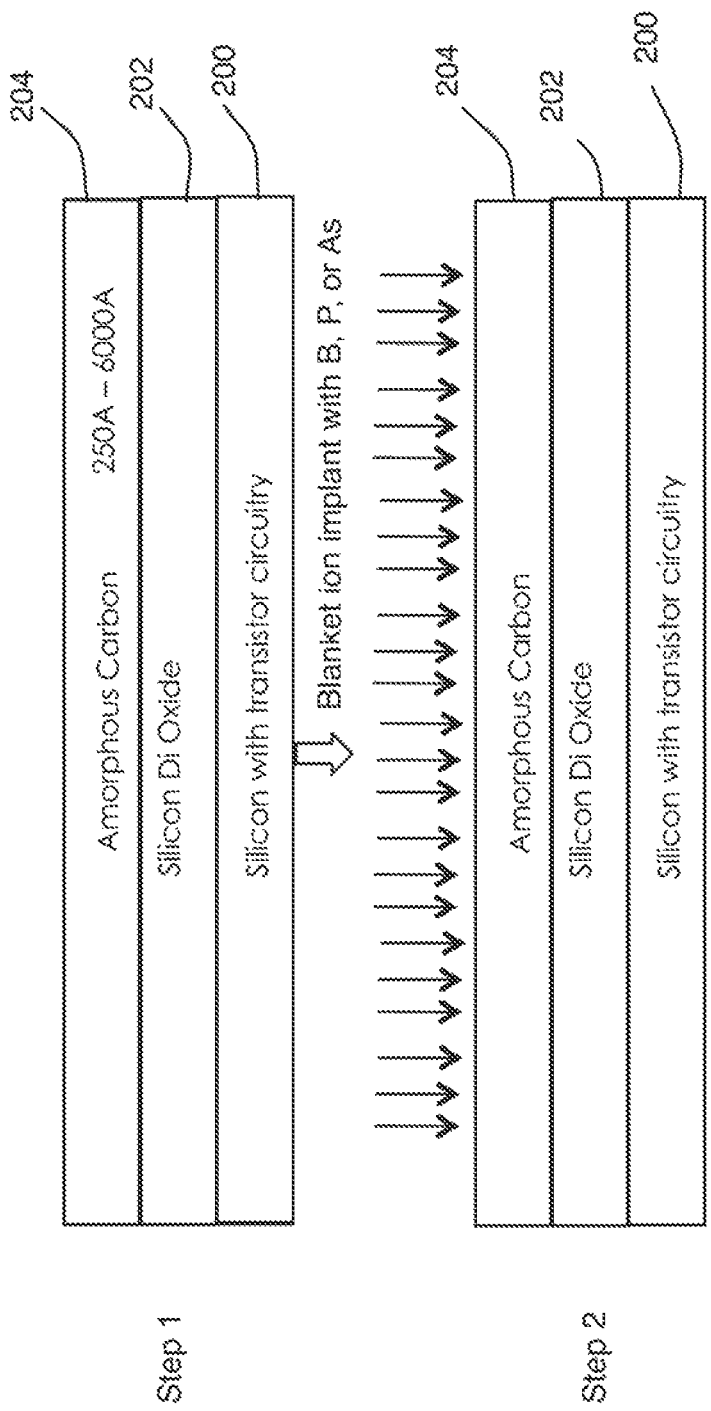
FIGS. 2A-B illustrates a process for forming conductive carbon ribbons for a magnetic memory, in accordance with a first embodiment of the invention.
Figure 2B:
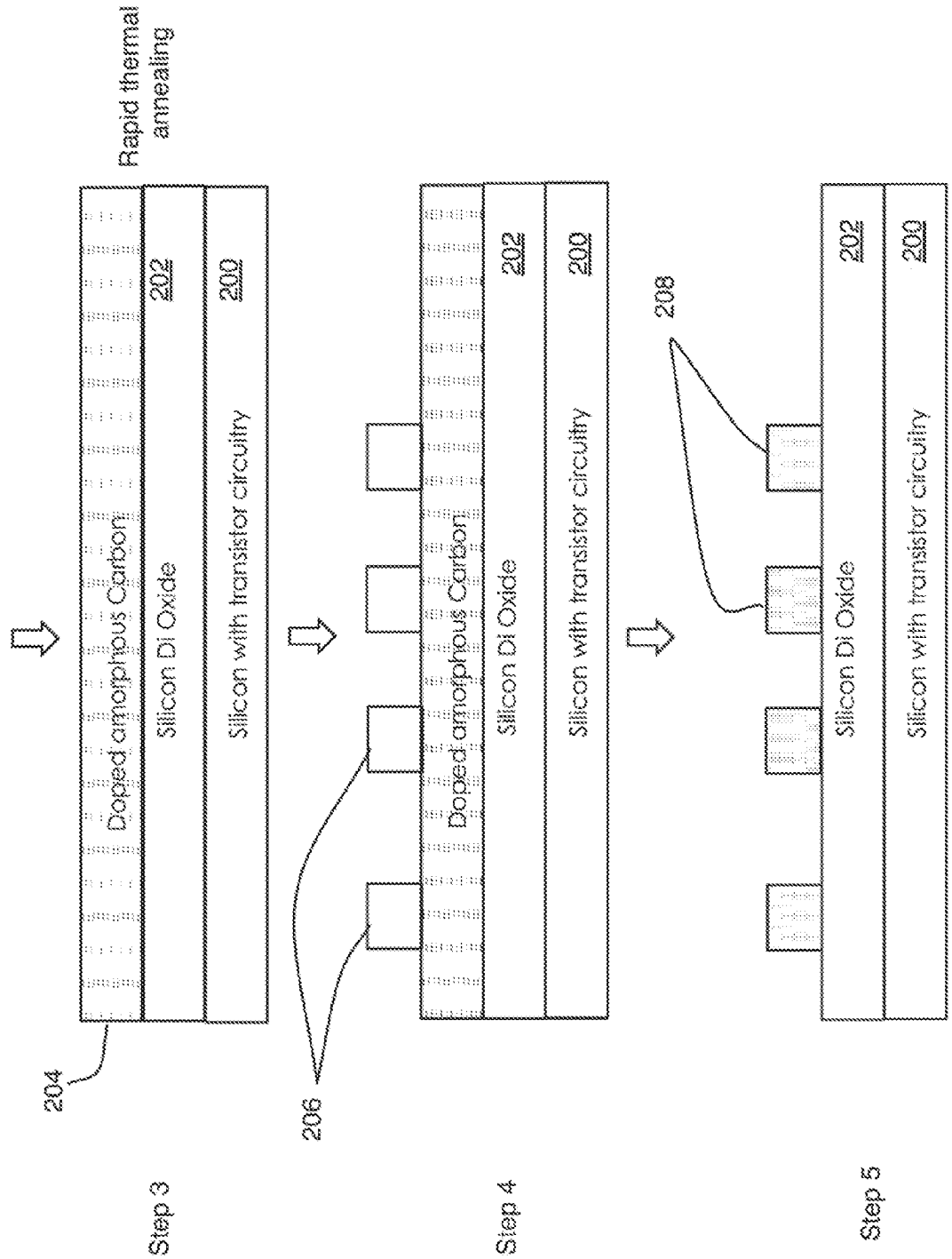

A first embodiment of a process for forming conductive carbon ribbons for a magnetic memory device is illustrated in FIGS. 2a-b. Referring to FIGS. 2a-b, reference numeral 200 indicates a silicon wafer with prefabricated circuitry, whereas reference numeral 202 indicates an oxide film layer or dielectric layer. At step 1, using PECVD (Plasma Enhanced Chemical Vapor Deposition) techniques with a suitable source such as C2H2 or C3H6, a film of amorphous carbon 204 is deposited on the layer 202. In one embodiment the layer 204 may be between 250 angstroms to 6000 angstroms. At step 2, the carbon layer 204 is doped/implanted with phosphorous or arsenic at an appropriate dose (ions/cm$^2$) and energy (KiloelectronVolt) to achieve a certain resistivity (ohm-cm) depending on the requirements of the magnetic device being built.

At step 3, the dopants are activated using rapid thermal annealing methods performed in a temperature range of 500-800 degree Celsius in a vacuum or in the presence of an inert gas or any other gas such as hydrogen to obtain the desired resistance values.

At step 4, photoresist is deposited on the layer 204 and lithographic techniques are used to pattern an process the photoresist into islands 208. one embodiment, the photoresist may include an antireflective coating often know was ARC for better optical definition of the photoresist.

At step 5, an etch is performed to form conductive carbon wires 208. This step may include reactive ion etching of the carbon layer 204 using an oxygen-based chemistry or any other suitable gas chemistry. The photoresist is then removed resulting in the carbon conductor wires 208 which would later form conductive wires of a magnetic memory device, e.g. an MRAM memory device, for carrying write currents.

Second Embodiment

Figure 3A:
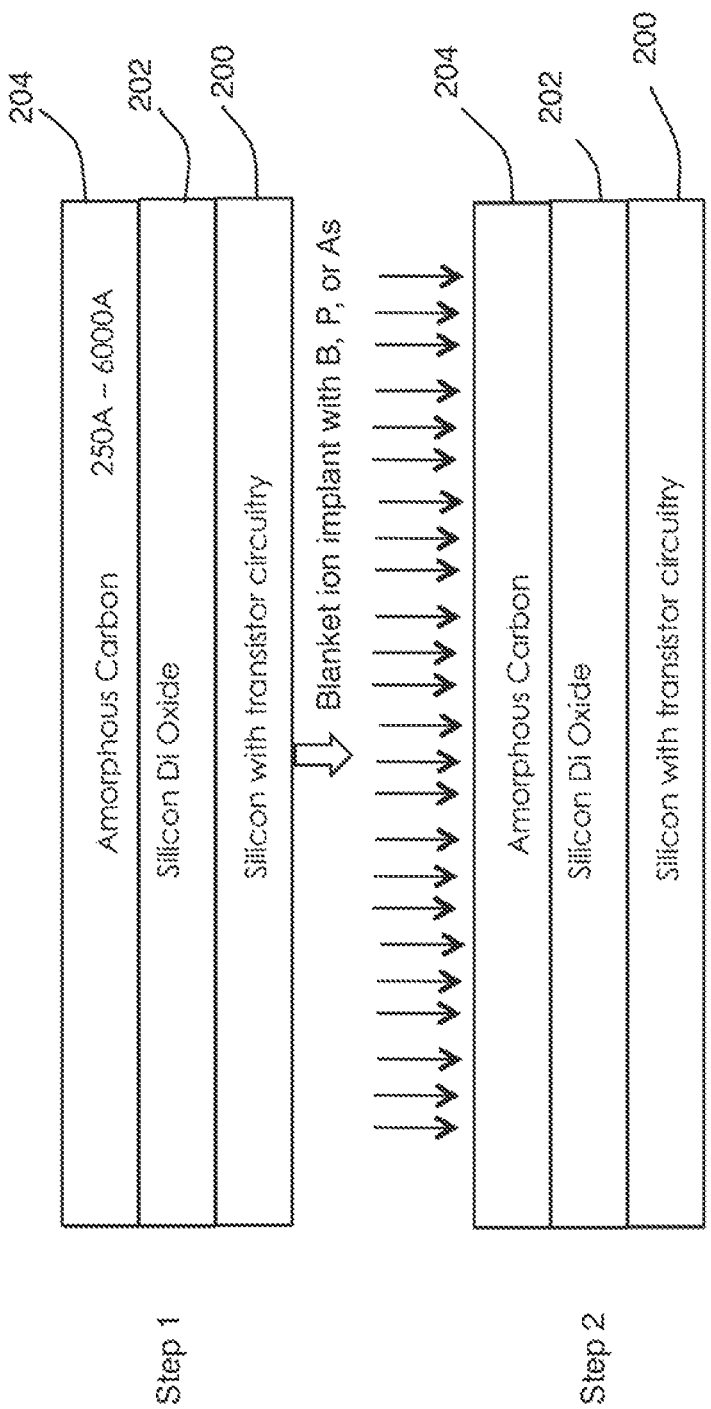
FIGS. 3A-C illustrates a process for forming conductive carbon ribbons for a magnetic memory, in accordance with a second embodiment of the invention.
Figure 3B:
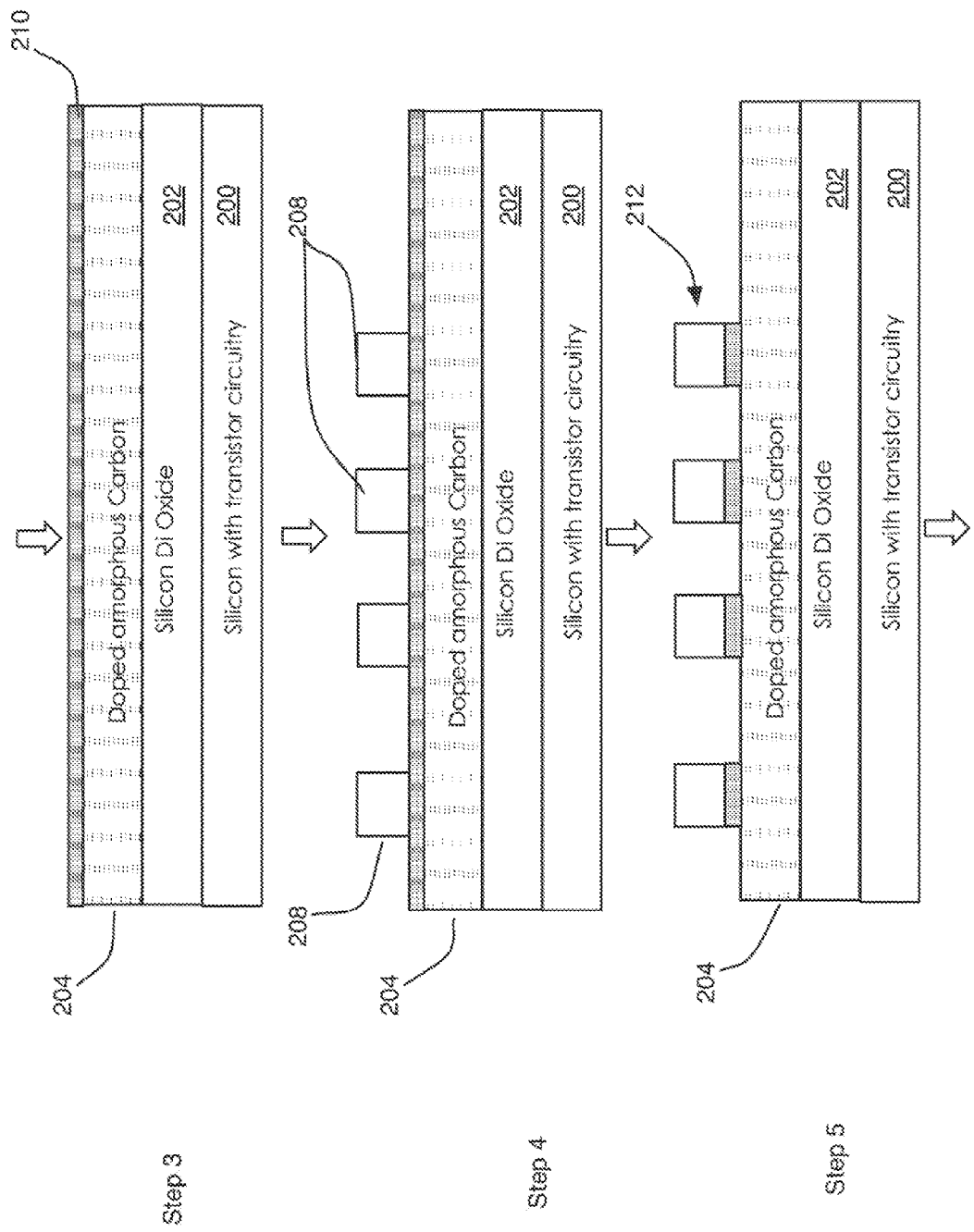
Figure 3C:
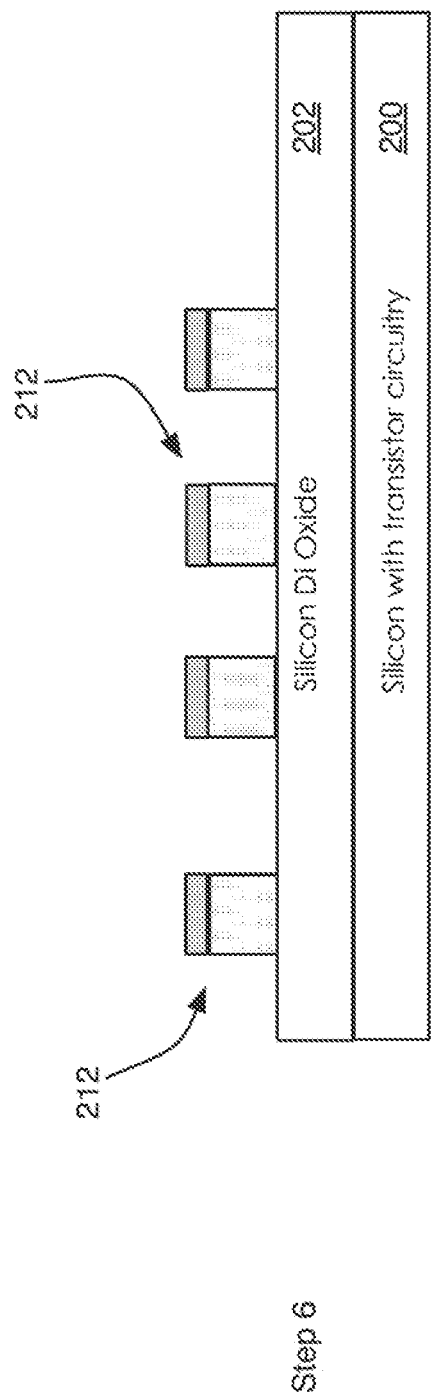

FIGS. 3A-3B illustrate a second embodiment for forming conductive carbon wires for a magnetic memory device. Referring to FIG. 3A, steps 1 and 2 are the same steps 1 and 2 of the first embodiment.

At step 3, a hard mask 210 is deposited over the doped carbon layer 204. The hard mask 210 may comprise aluminum, oxide, or nitride.

At step 4, a photolithographic process is used to deposit and pattern photoresist on the hard mask layer 210. The result of this photolithographic process includes islands of photoresist 208. The hard mask 210 helps to better define the carbon conductors in cases where precise and fine dimensions are required.

At step 5, the hard mask is etched and at step 6 the carbon layer 204 is etched. The result is precisely defined carbon conductors 212 that each include a remnant of the layer 204 and a remnant of the hard mask layer 210, as can be seen from FIG. 3C.

Third Embodiment

Figure 4A:
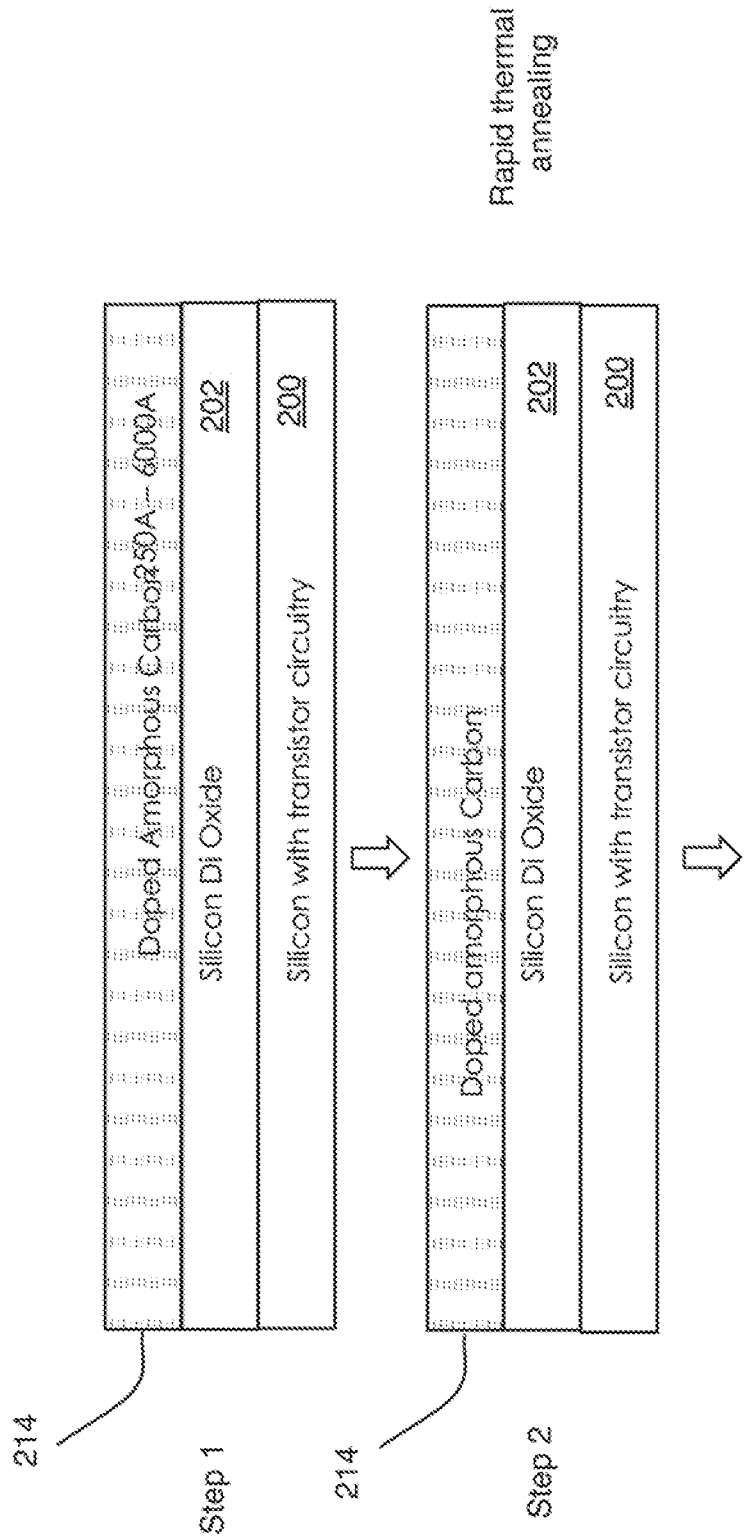
FIGS. 4A-B illustrates a process for forming conductive carbon ribbons for a magnetic memory, in accordance with a third embodiment of the invention.
Figure 4B:
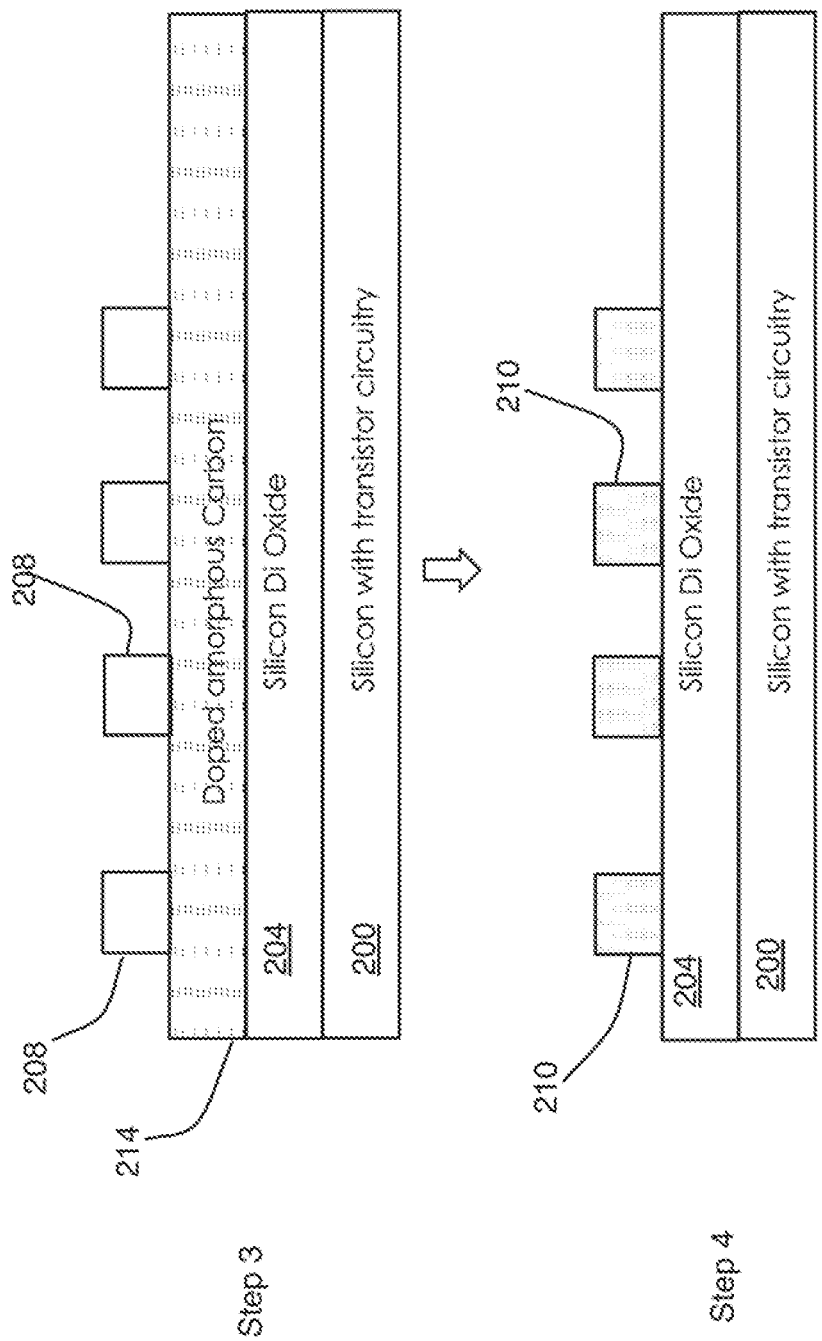

FIGS. 4A-4b illustrates a third embodiment for forming conductive carbon wires for a magnetic memory device. Referring to FIG. 4A, at step 1, a carbon film layer is 214 is deposited over the layer 202 using PECVD (Plasma Enhanced Chemical Vapor Deposition) techniques and a C2H2, C3H6 or similar source. This step is similar to the first step of the first embodiment. However, a gas phase dopant may be included with the source thereby to avoid a separate doping step such the step 2 of the first embodiment. According to different embodiments, the dopants may include phosphorous, arsenic, or nitrogen and may be from a gas phase source such as POCl3 (phosphoryl chloride), arsine, and N$_2$.

At step 2, the dopants thus incorporated chemically are activated using rapid thermal annealing methods in a temperature range of 500-800 C. The rapid thermal annealing may be carried out in a vacuum, or in the presence of inert gas or any other gas such as hydrogen to tune the resistance values desired.

At step 3, lithographic techniques are used to pattern and process photoresist on the carbon film 214 into islands of photoresist 208 to protect the underlying carbon film 214 during etching.

At step 4, an etch is performed. This step may include reactive ion etching of carbon using an oxygen based chemistry or any other suitable gas chemistries. The photoresist is then removed resulting in the carbon conductor wires 210 which would form the conductive wires of an MRAM memory cell that carries a write current.

Fourth Embodiment

Figure 5A:
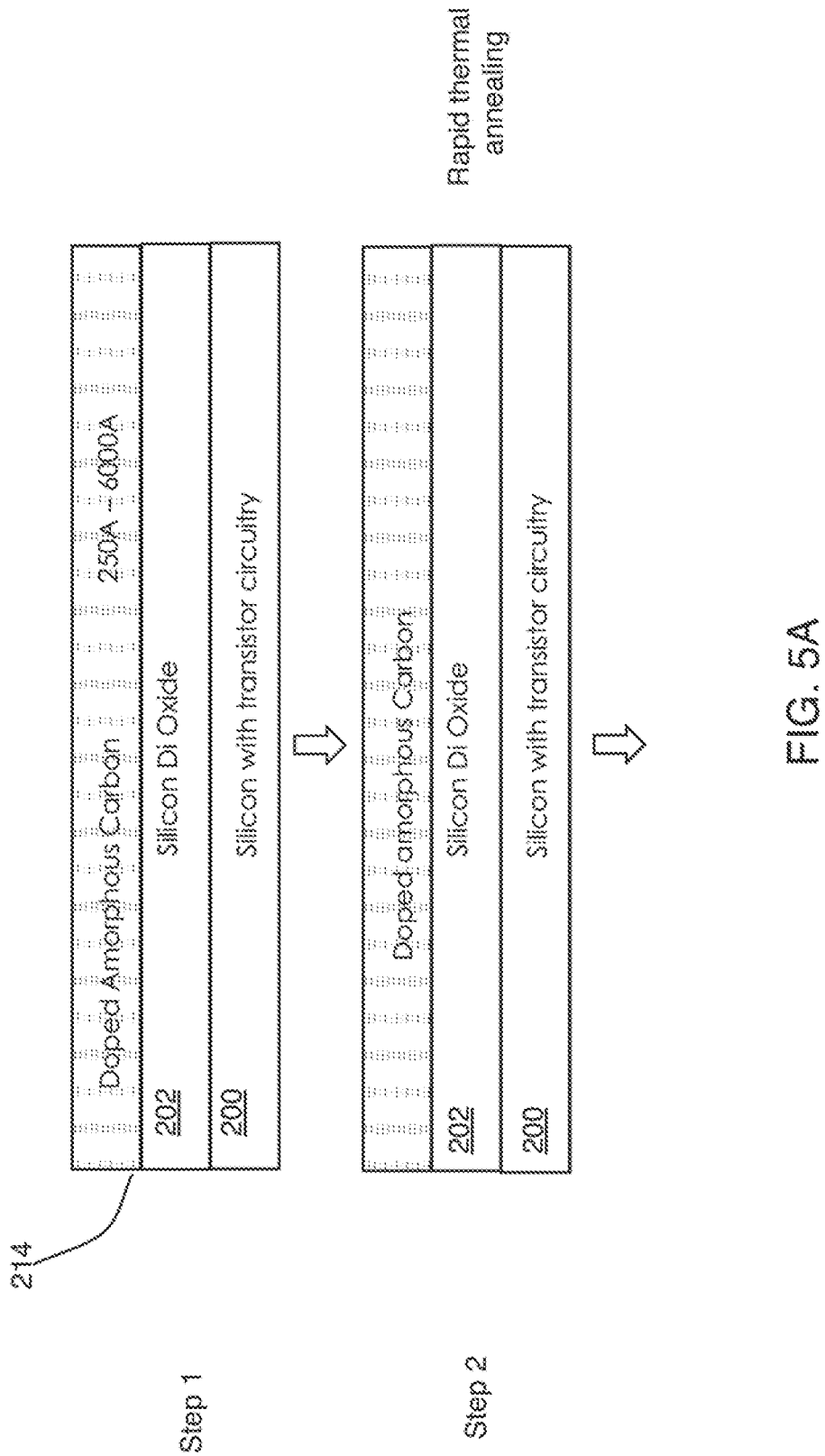
FIGS. 5A-C illustrates a process for forming conductive carbon ribbons for a magnetic memory, in accordance with a fourth embodiment of the invention.
Figure 5B:
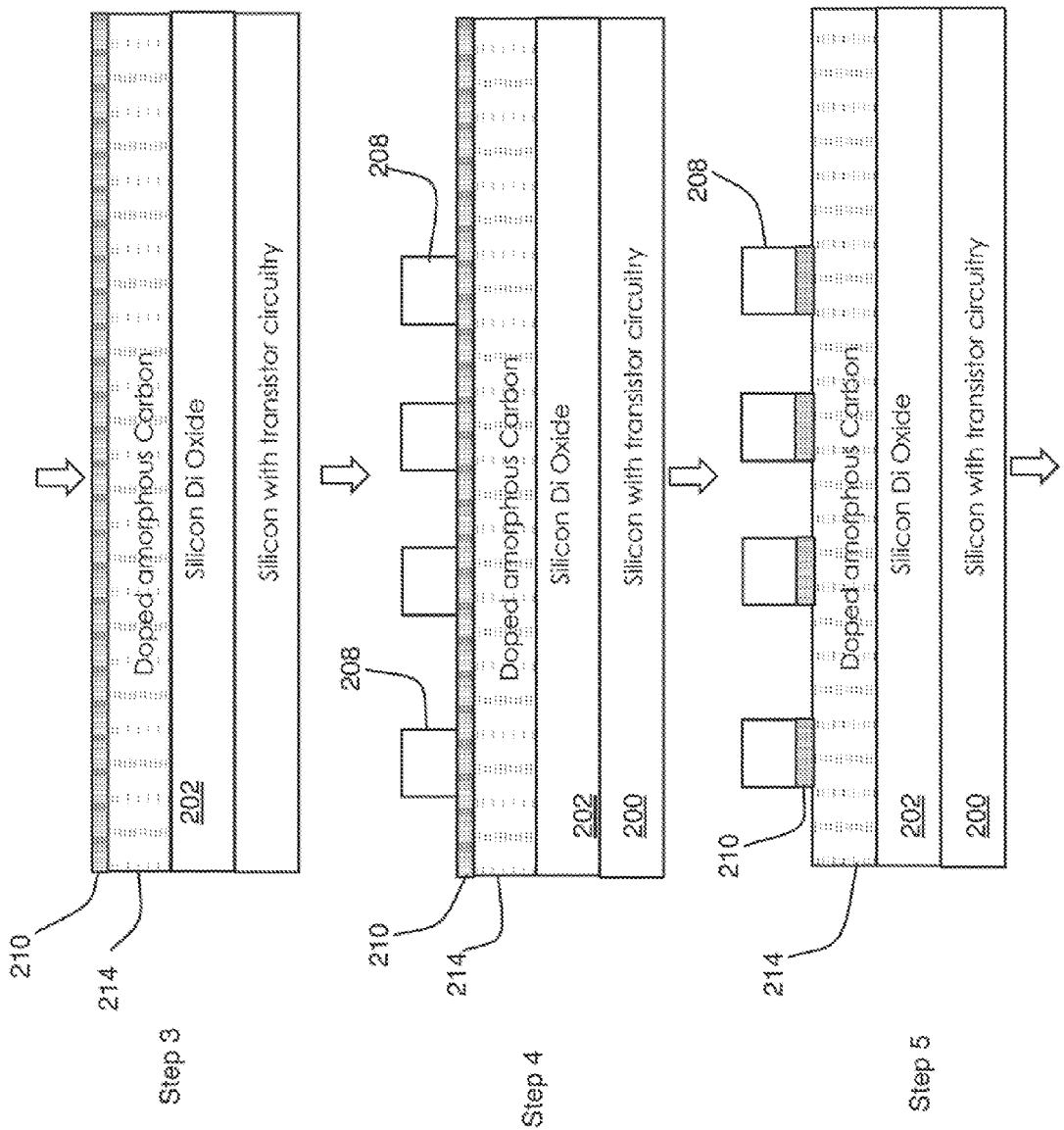
Figure 5C:
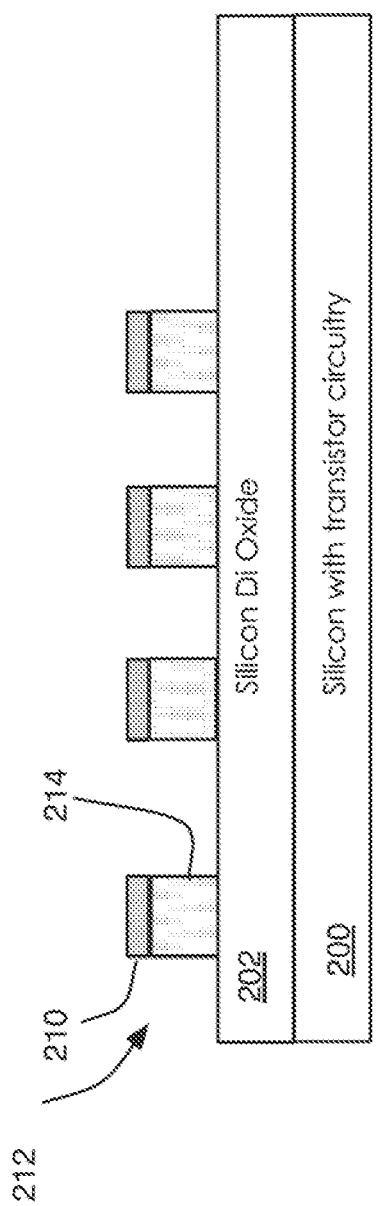

This embodiment is described with reference to FIGS. 5A-5C. At step 1, which is similar to the step 1 of the third embodiment, a carbon film layer is deposited from C2H2, C3H6, or similar source by PECVD (Plasma Enhanced Chemical Vapor Deposition). Dopants such as phosphorous, arsenic, or nitrogen are incorporated into the layer 400 from a suitable gas-phase dopant source such as POCl3 (phosphoryl chloride), arsine, or N$_2$.

At step 2, the dopants are activated using rapid thermal annealing methods carried out at a temperature range of 500-800 degrees C. in a vacuum or in the presence of an inert gas or any other gas such as hydrogen to tune the resistance values desired.

At step 3 includes a hard mask layer 210 such as aluminum, oxide, or nitride is deposited at step 4, This a photoresist layer is deposited, patterned and process using photolithographic techniques to define island of photoresist 208 on the hard mask layer 210. The hard mask helps to better define the carbon conductors in cases where precise and fine dimensions are critical. At step 5, the hard mask layer is etched, and at step 6 the carbon layer 214 is etched. The result is a plurality of conductive carbon wires 212 the run into the plane of the drawing. Each conductive area has a portion that corresponds to the layer 214 and a portion that corresponds to the layer 210.

Fifth Embodiment

Figure 6A:
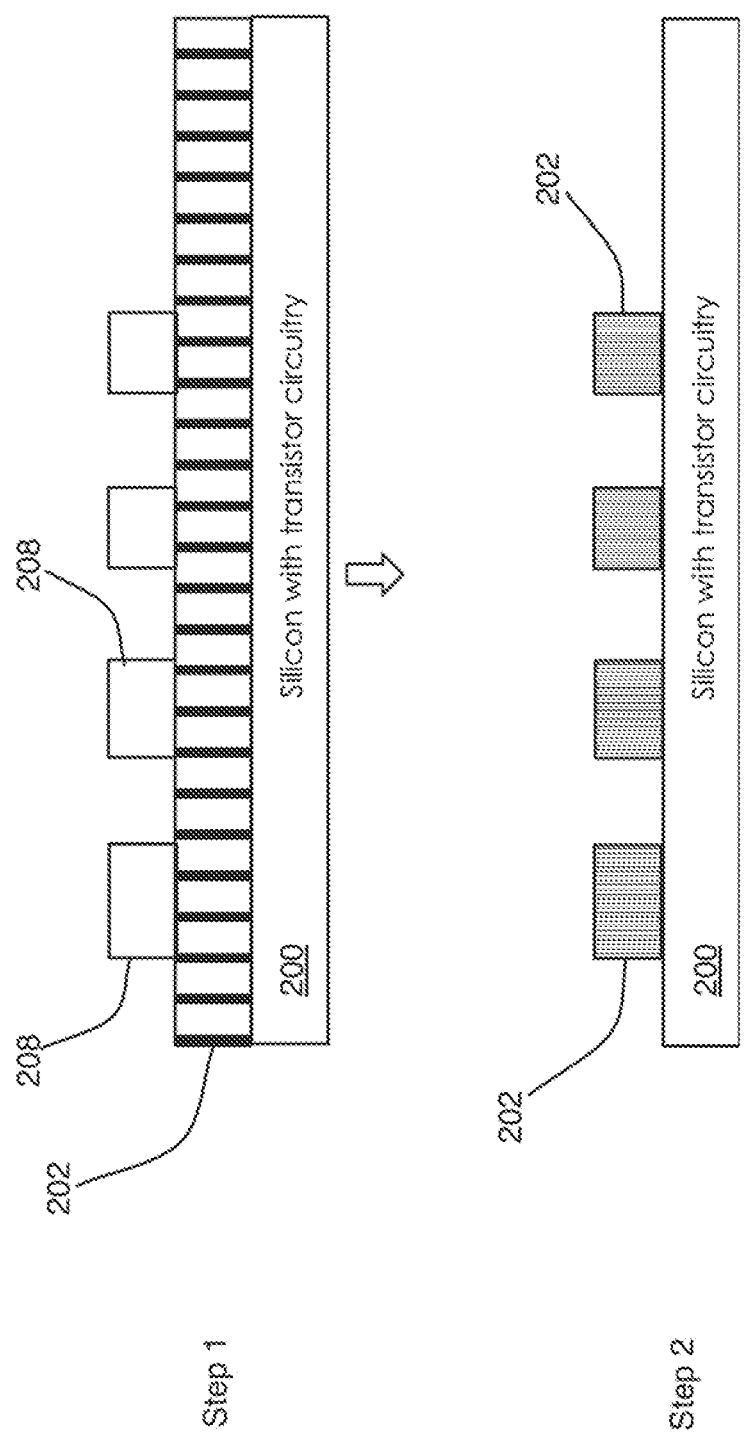
FIGS. 6A-B illustrates a process for forming conductive carbon ribbons for a magnetic memory, in accordance with a fifth embodiment of the invention.
Figure 6B:
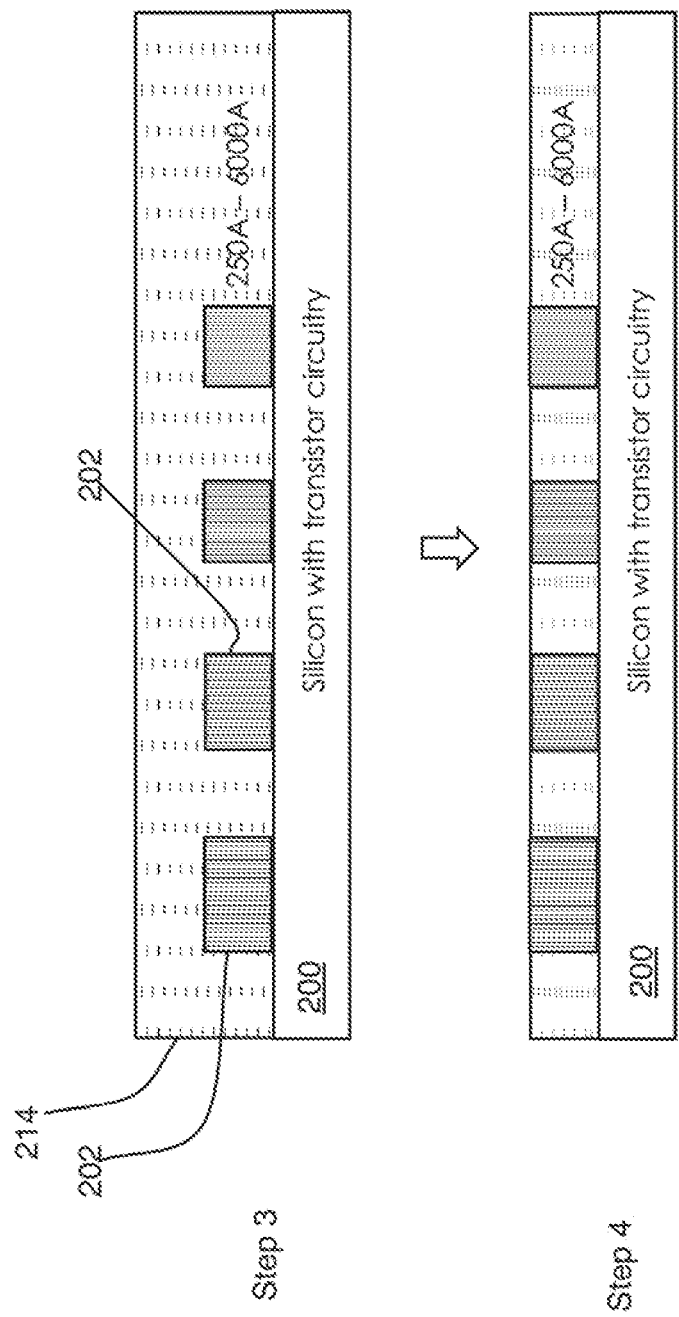

FIGS. 6A and 6B illustrate is a fifth embodiment for fabricating conductive carbon wires/ribbons for magnetic memory devices. In this embodiment, the conductive carbon wires are fabricated by chemical doping and CMP (Chemical Mechanical Polishing). At step 1, a layer of photoresist is deposited over a substrate comprising a layer 200 with prefabricated transistor circuitry, and a dielectric layer 202. Using photolithographic techniques, the photoresist is patterned and processed to leave behind islands of photoresist 208 that serve to protect the underlying dielectric layer 202 during etching.

At step 2, the dielectric layer 202 is etched by well known methods in the semiconductor industry to form trenches that are 250 angstroms to 6000 angstroms deep.

At step 3, doped carbon film layer 214 from C2H2, C3H6 or a similar source is deposited by PECVD (Plasma Enhanced Chemical Vapor Deposition).

At step 4, the layer 214 is processed by CMP techniques. The CMP is performed until the layer 214 is flush with the dielectric 202. The result is structure that include dielectric trenches 208 separated by conductive carbon ribbons 210 that run into the plane of the drawing. The carbon ribbons 210 thus formed may be used as a wire of an MRAM memory cell to carry a write current.

Sixth Embodiment

Figure 7B:
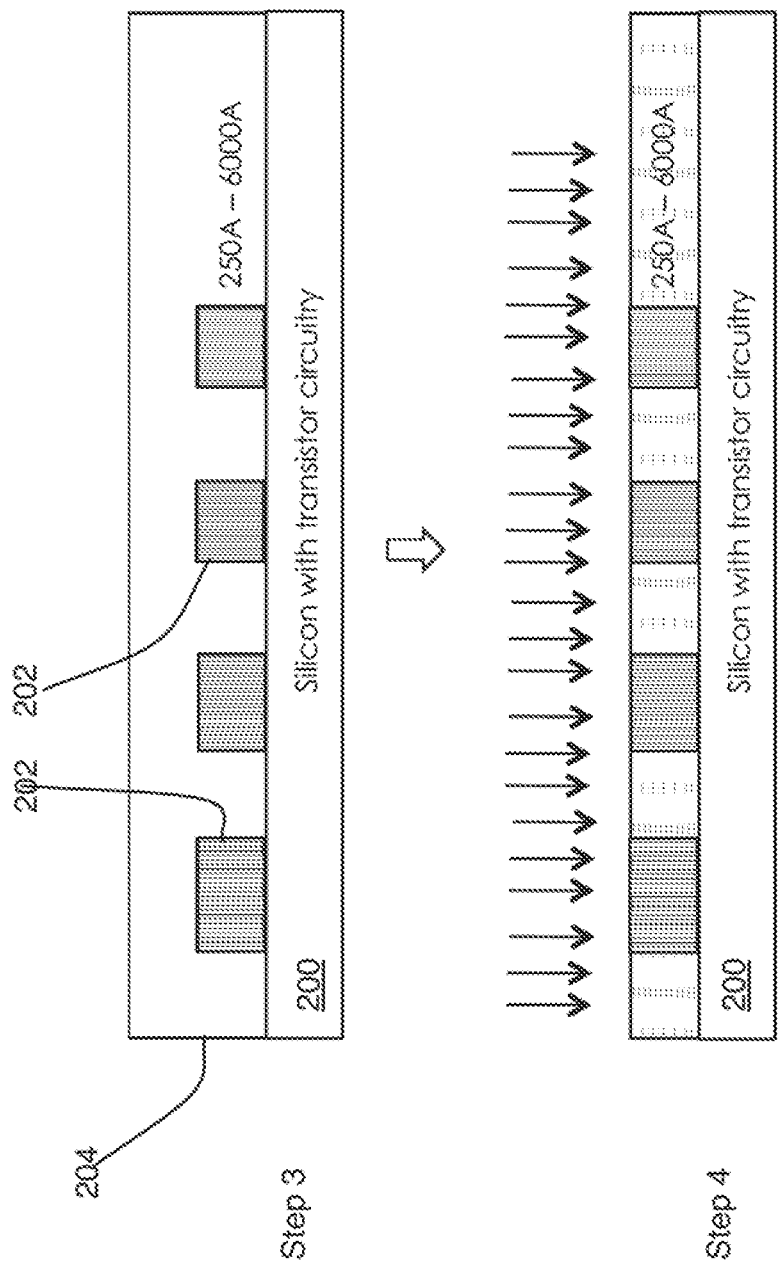

FIGS. 7A and 7B of the drawings illustrate a sixth embodiment for fabricating conductive carbon wires for a memory device such as an MRAM memory device. This embodiment is similar to the fifth embodiment except the implant doping is used instead of chemical doping.

At step 1, photoresist islands 208 are defined photolithographically on oxide or nitride layer 204 on a semiconductor wafer 200 with transistor circuits prefabricated thereon.

At step 2, the dielectric 202 is etched by well known methods in the semiconductor industry to form trenches that are 250 angstroms to 6000 angstroms deep.

At step 3, carbon film layer 204 from C2H2, C3H6 or a similar source is deposited by PECVD (Plasma Enhanced Chemical Vapor Deposition).

At step 4, CMP techniques are used on the carbon film layer 204 to reduce the layer so that it is flush with the dielectric islands 202. The result is a structure which includes carbon ribbons/wires 208 separated by islands or strips of dielectric trenches 202.

Next an ion implantation step is performed to implant a dopant into the wires 208 with B, P, or As, or similar ions. Finally, a rapid thermal annealing step is done to activate the dopants. The rapid thermal annealing step may be performed in a vacuum or in the presence of an inert gas or any other gas such as hydrogen.

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A magnetic memory device, comprising:
   a first carbon layer including a plurality of carbon word lines;
   a second carbon layer including a plurality carbon bit lines, wherein the plurality of carbon bit lines overlies the plurality of carbon word lines to define a plurality of crossover zones; and
   a plurality of magnetic tunnel junction (MTJ) stacks, each MTJ stack disposed within a crossover zone of the plurality of crossover zones;
   wherein at least one of the first carbon layer and the second carbon layer comprises activated dopants.

2. The magnetic memory device of claim 1, wherein at least one of the first carbon layer and the second carbon layer is formed from a carbon source selected from the group consisting of C2H2 and C3H6.

3. The magnetic memory device of claim 1, wherein at least one of the first carbon layer and the second carbon layer comprises a dopant selected from the group consisting of phosphorous, arsenic, and nitrogen.

4. The magnetic memory device of claim 1, further comprising a substrate that includes transistor circuitry and an oxide layer that overlies the transistor circuitry.

5. The magnetic memory device of claim 1, wherein each MTJ stack comprises a free layer, a tunnel oxide layer, and a fixed layer.

6. The magnetic memory device of claim 5, wherein:
   the free layer of each MTJ stack is connected to a respective carbon bit line of the plurality of carbon bit lines;
   the fixed layer of each MTJ stack is electrically coupled to a read transistor for the respective MTJ stack via a bottom electrode for the respective MTJ stack; and
   the fixed layer of each MTJ stack is further positioned above a respective carbon word line of the plurality of carbon word lines and is configured to be subject to a magnetic field of the respective carbon word line when energized.

7. A magnetic memory device, comprising:
   a first carbon layer including a plurality of carbon word lines;
   a second carbon layer including a plurality of carbon bit lines, wherein the plurality of carbon bit lines overlies the plurality of carbon word lines to define a plurality of crossover zones;
   a plurality of magnetic tunnel junction (MTJ) stacks, each MTJ stack disposed within a crossover zone of the plurality of crossover zones; and
   a hard mask over at least one of the first carbon layer and the second carbon layer.

8. The magnetic memory device of claim 7, wherein at least one of the first carbon layer and the second carbon layer comprises activated dopants.

9. The magnetic memory device of claim 7, wherein at least one of the first carbon layer and the second carbon layer comprises dopants activated via rapid thermal annealing.

10. The magnetic memory device of claim 7, wherein the hard mask comprises a material selected from the group consisting of aluminum, oxide, and nitride.

11. A magnetic memory cell for a magnetic random access memory circuit, the magnetic memory cell comprising:
   a carbon word line of a first carbon layer;
   a carbon bit line of a second carbon layer, wherein the carbon bit line overlies the carbon word line to define a crossover zone; and
   a magnetic tunnel junction (MTJ) stack disposed between the carbon word line and the carbon bit line within the crossover zone;
   wherein at least one of the carbon word line and the carbon bit line comprises activated dopants.

12. The magnetic memory cell of claim 11, wherein at least one of the carbon word line and the carbon bit line is formed from a carbon source selected from the group consisting of C2H2 and C3H6.

13. The magnetic memory cell of claim 11, wherein at least one of the carbon word line and the carbon bit line comprises a dopant selected from the group consisting of phosphorous, arsenic, and nitrogen.

14. The magnetic memory cell of claim 11, further comprising a substrate that includes transistor circuitry and an oxide layer that overlies the transistor circuitry.

15. The magnetic memory cell of claim 11, wherein:
   the MTJ stack comprises a free layer, a tunnel oxide layer, and a fixed layer;
   the free layer is connected to the carbon bit line;
   the fixed layer is electrically coupled to a read transistor via a bottom electrode for the MTJ stack; and
   the fixed layer is further positioned above the carbon word line and is configured to be subject to a magnetic field of the carbon word line when energized.

16. A magnetic memory cell for a magnetic random access memory circuit, the magnetic memory cell comprising:
   a carbon word line of a first carbon layer;
   a carbon bit line of a second carbon layer, wherein the carbon bit line overlies the carbon word line to define a crossover zone;
   a magnetic tunnel junction (MTJ) stack disposed between the carbon word line and the carbon bit line within the crossover zone; and
   a hard mask over at least one of the carbon word line and the carbon bit line.

17. The magnetic memory cell of claim 16, wherein at least one of the carbon word line and the carbon bit line comprises activated dopants.

18. The magnetic memory cell of claim 16, wherein at least one of the carbon word line and the carbon bit line comprises dopants activated via rapid thermal annealing.

19. The magnetic memory cell of claim 16, wherein the hard mask comprises a material selected from the group consisting of aluminum, oxide, and nitride.

20. The magnetic memory cell of claim 16, wherein:
    the MTJ stack comprises a free layer, a tunnel oxide layer, and a fixed layer;
    the free layer is connected to the carbon bit line;
    the fixed layer is electrically coupled to a read transistor via a bottom electrode for the MTJ stack; and
    the fixed layer is further positioned above the carbon word line and is configured to be subject to a magnetic field of the carbon word line when energized.

* * * * *